United States Patent

Okuno et al.

[11] Patent Number: 5,338,008
[45] Date of Patent: Aug. 16, 1994

[54] SOLDER REFLOW FURNACE

[75] Inventors: Tetsuya Okuno, Shoka; Takashi Nauchi, Tokyo, both of Japan

[73] Assignee: Senju Metal Industry Co., Ltd., Tokyo, Japan

[21] Appl. No.: 62,160

[22] Filed: May 17, 1993

Related U.S. Application Data

[63] Continuation of Ser. No. 791,108, Nov. 13, 1991, abandoned.

[30] Foreign Application Priority Data

Nov. 15, 1990 [JP] Japan .............................. 2-118910[U]

[51] Int. Cl.5 .................................................. F27B 9/36
[52] U.S. Cl. ........................................ 266/105; 432/152
[58] Field of Search ...................... 266/105, 111, 103; 432/121, 128, 194, 198, 200, 152

[56] References Cited

U.S. PATENT DOCUMENTS 4,574,182  3/1986  Pescatore et al. .................. 219/388
4,938,410  3/1990  Kondo ................................ 228/180.1

FOREIGN PATENT DOCUMENTS

| 0109892 | 5/1984 | European Pat. Off. |
| 0323451 | 7/1989 | European Pat. Off. |
| 62-183960 | 8/1987 | Japan |
| 64-83395 | 3/1989 | Japan |
| 1-118369 | 5/1989 | Japan |
| 2-44185 | 2/1990 | Japan |

Primary Examiner—Scott Kastler
Attorney, Agent, or Firm—Sughrue, Mion, Zinn, Macpeak & Seas

[57] ABSTRACT

A solder reflow furnace includes piping to supply an inert gas into the furnace to maintain an inert gas atmosphere within the furnace and a cooling zone provided next to a main heating zone. The cooling zone is provided with a gas cooling device in which printed circuit boards after soldering are cooled by an inert cooling gas which is in turn cooled indirectly by air outside the furnace so that air is prevented from flowing into the furnace.

5 Claims, 2 Drawing Sheets

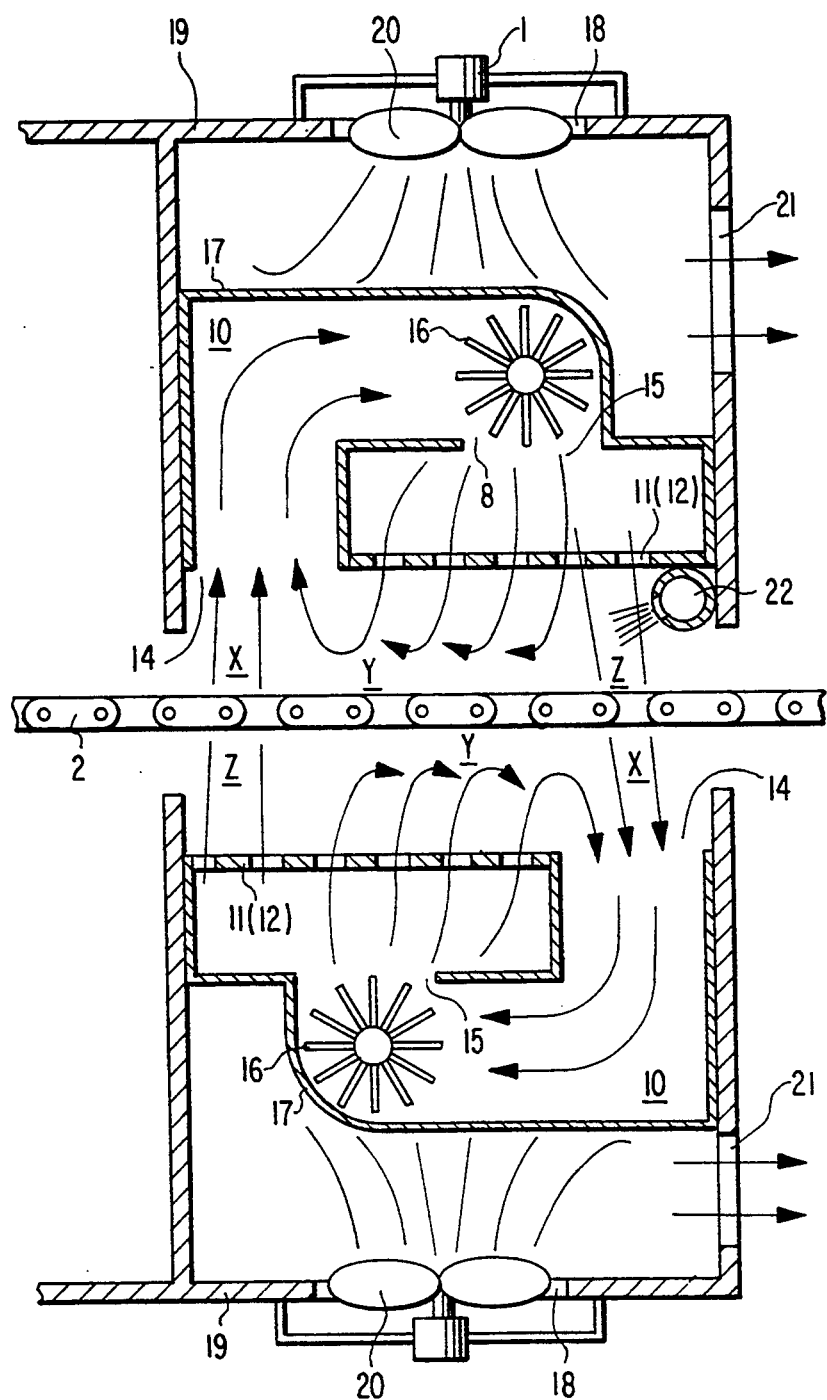

SOLDER REFLOW FURNACE

This is a continuation of application Ser. No. 07/791,108 filed Nov. 13, 1991, now abandoned.

BACKGROUND OF THE INVENTION

The present invention relates to a reflow furnace for use in soldering of electronic components to a printed-circuit board using solder paste, and particularly to a reflow furnace in which soldering is carried out in an inert atmosphere.

Printed circuit boards which have been soldered are washed with a fluorine-containing solvent or chlorine-containing solvent to remove flux residuals in order to ensure reliability of the printed circuit boards. However, fluorine-containing solvents cause destruction of the ozone layer surrounding the Earth with an increase in uv radiation reaching the Earth's surface, which is thought to be harmful to human beings. On the other hand, chlorine-containing solvents cause pollution of underground water, making the water unsuitable as drinking water. Thus, strict regulations are applied to the use of such solvents so that an increase in production costs is inevitable.

Recently, a solder paste of the "low-residue" type has been used. The solder paste of this type contains a flux component comprising a reduced amount of solid matter such as rosin, and an activating agent (hereunder referred to as "mildly-activated rosin flux"), and the printed circuit board which is soldered using this type of solder paste does not require washing with a solvent after soldering. A mildly-activated rosin flux is a flux in which the content of rosin and an activating agent is reduced to as low a level as possible so that washing of the flux after soldering can be eliminated.

Generally, soldering with solder paste has been carried out in a reflow furnace in the presence of air, i. e., oxygen. However, soldering in air results in many soldering defects, e. g., formation of unsoldered portions and minute solder balls, which are caused by the presence of oxygen in the air. This is because the oxygen contained in the air easily oxidizes the soldering surface being heated in the furnace, and the oxidized surface adversely affects the spreading of molten solder.

It is known that if heating is carried out in the absence of oxygen, i.e., in an inert gas atmosphere such as one containing nitrogen gas, carbon dioxide gas, or argon gas, soldering can be carried out successfully without occurrence of any soldering defects. See Japanese Patent Application Laid-Open Specifications No. 64-83395/1989, No. 1-118369/1989, and No. 2-44185/1990.

In a solder reflow furnace containing an inert gas atmosphere (hereunder referred to as an "inert gas reflow furnace" or a "nitrogen reflow furnace"), the oxygen content is restricted to 3% by volume or less in order to diminish soldering defects when the soldering is carried out using solder paste, which is generally accepted as being superior with respect to solderbility. However, in the case of a solder paste employing an RMA flux (mildly-activated rosin flux), it is desirable to restrict the oxygen content to 1000 ppm (volume) or less, i.e., 0.1% by volume or less, since the low-residue paste solder is not so activated that it is rather difficult to remove an oxide film once formed on a soldering surface. As stated above, an oxidized soldering surface has an adverse effect on the spreading of molten solder and it also causes formation of minute solder balls from the oxidized solder alloy particles.

In the case of a low-residue type solder paste, the use of an inert gas reflow furnace is advantageous for further improving the spreading of molten solder alloy and markedly suppressing formation of minute solder balls.

Thus, in the case of an inert gas reflow furnace, the lower the oxygen content within the furnace, the more widely the molten solder alloy spreads and the less the formation of solder balls takes place.

Furthermore, in the case of conventional furnaces, when a large amount of nitrogen gas is introduced into the furnace, excess nitrogen gas flows out of the furnace through the inlet and outlet ports. It has been thought, therefore, that no air comes into the furnace. However, according to the experiences of the present inventors, it is inevitable that air comes into the furnace to increase the oxygen content to higher than 1000 ppm (volume) even if a large amount of nitrogen gas is supplied into the furnace. This tendency is marked for a reflow furnace of the circulating gas type.

Japanese Patent Application Laid-Open Specification No. 62-183960/1987 proposes the provision of dual shutters each at the outlet and inlet ports of a nitrogen gas reflow furnace so as to decrease the oxygen content in the atmosphere within the furnace.

However, a nitrogen gas reflow furnace with shutters installed at its entrances has many disadvantages. For example, it is necessary to provide a pair of dual shutters at both the outlet and inlet ports together with a waiting zone between the dual shutters and it is impossible to use a conveyor so as to carry printed circuit boards into and out of the furnace. Instead, a pusher must be used to transport printed circuit boards through the furnace. A continuous carrying system cannot be achieved using a pusher, and it takes time for each of the dual shutters to be opened one by one. After the first shutter is opened, the circuit boards to be soldered have to be kept waiting in the waiting zone until the second shutter is opened- This markedly decreases productivity. Furthermore, the provision of shutters and pushers makes the structure of the reflow furnace complicated, and it is rather difficult to synchronize the pusher with the shutter when printed circuit boards are taken into or taken out of the furnace.

However, in the conventional nitrogen gas reflow furnace which is free from shutters it is impossible to reduce the content of oxygen thoroughly even if an increased amount of nitrogen gas is introduced into the furnace.

SUMMARY OF THE INVENTION

An object of the present invention is to provide a solder reflow furnace in which the inflow of air can be suppressed drastically even when the furnace employs a conveyor.

Another object of the present invention is to provide an inert gas reflow furnace in which the inflow of air can be suppressed drastically even when a decreased amount of an inert gas such as nitrogen gas is introduced into the furnace.

The inventors of the present invention discovered that in a conventional nitrogen reflow furnace, the nitrogen gas introduced into the furnace constantly allows out of an inlet port of the preheating zone and an outlet port of the main heating zone, but as a cooling gas air is blown against the soldered printed circuit boards in the cooling zone, and that this flow of cooling air enters into the main heating zone and the preheating zone. It occurred to the present inventors that if air from the outside is not used as a cooling gas, but a circulating gas within the cooling zone can be used as a cooling gas by cooling it with air from the outside, and the inflow of air from outside the furnace can be suppressed efficiently.

The solder reflow furnace of the present invention therefore comprises a preheating zone, a main heating zone, a cooling zone, and a conveyor for carrying printed circuit boards, characterized in that the cooling zone is provided with a cooling device comprising a cooling gas circulating means and a heat exchanging means.

Preferably, the cooling zone comprises a pair of cooling devices in which a gas inlet port and a gas outlet port are provided in the same plane, and the gas inlet port of one cooling device is disposed opposite the gas outlet port of the opposing cooling device, and each of the cooling devices comprises the heat exchanging means.

The solder reflow furnace preferably comprises means for maintaining an inert gas atmosphere within the furnace. The means may be piping to supply an inert gas into the furnace to maintain an inert gas atmosphere within the furnace.

Thus, in a preferred embodiment of the present invention, the solder reflow furnace comprises a preheating zone, a main heating zone, a cooling zone, a conveyor for carrying printed circuit boards, characterized in that the cooling zone comprises a pair of cooling devices in each of which a gas inlet port and a gas outlet port are provided in the same plane, and the cooling gas inlet port of one device is opposite the cooling gas outlet port of the opposing device, and each of the cooling devices comprises a heat exchanging means which is in thermal contact with the cooling gas, and which achieves heat exchange with the cooling gas circulating within the cooling device. Namely, the heat exchanging means may cool the cooling gas circulating within the cooling device indirectly.

In a further preferred embodiment, the heat exchanging means comprises an air inlet port, an air outlet port, and an air blowing means which may be a fan provided in the air inlet port. Air outside the furnace is blown against the cooling device to achieve indirect heat exchange with the cooling gas circulating within the cooling device.

According to such a preferred embodiment, air outside the furnace is successfully prevented from getting into the furnace.

The heat exchanging means may be provided preferably on both of the pair of the cooling devices provided in the air cooling zone.

BRIEF DESCRIPTION OF THE DRAWINGS

FIG. 2 is a view of a cooling zone in which a pair of cooling devices are provided on both of the top and bottom portions of the cooling zone.

DESCRIPTION OF THE PREFERRED EMBODIMENTS

Figure 1:
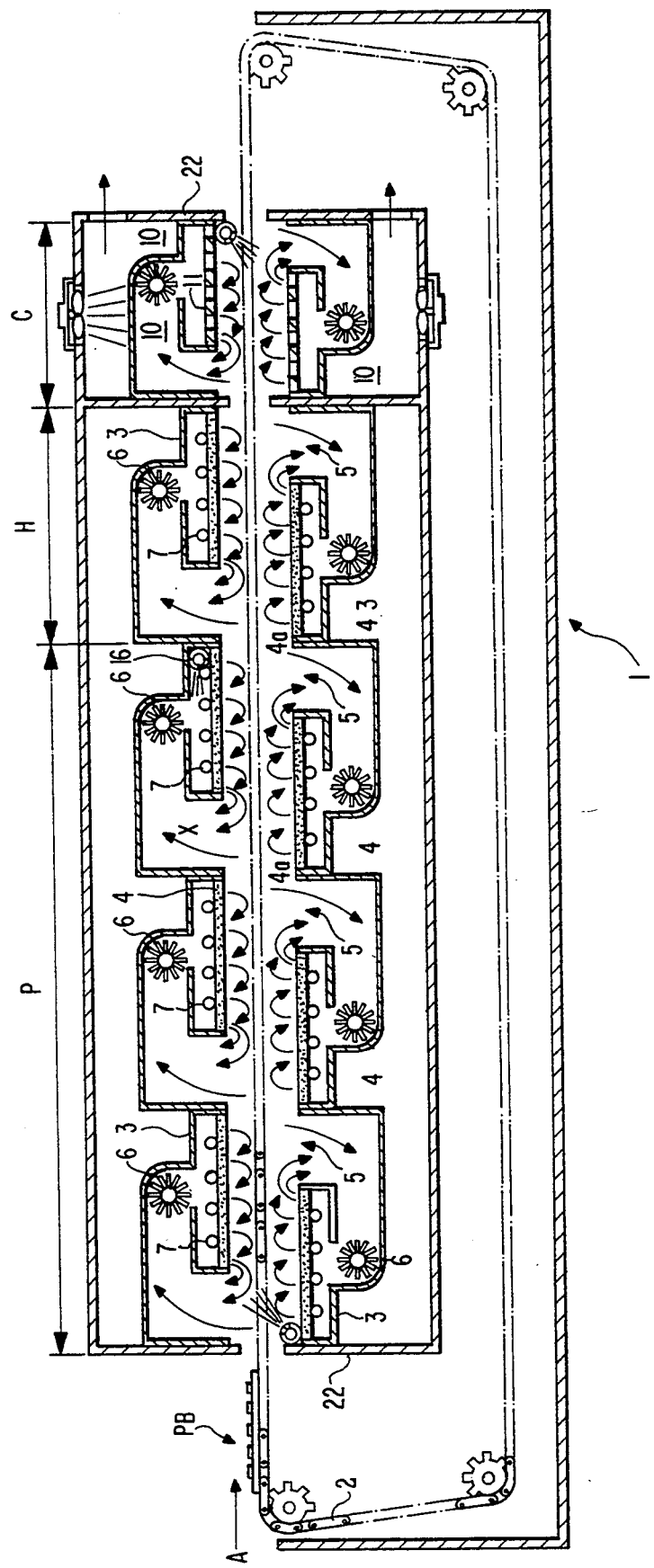
FIG. 1 is a longitudinal, schematic sectional view of a solder reflow furnace of the present invention.

As shown in FIGS. 1–2, a solder reflow furnace 1 of the present invention comprises a preheating zone P, a main heating zone H, and a cooling zone C. A conveyor 2 travels through the reflow furnace 1 to convey a printed circuit board PB in the direction A.

The solder reflow furnace illustrated in FIG. 1 is of the gas-circulating type, and a series of pairs of heaters 3, 3 the surface-blowing type are provided on the top and bottom portions of the main heating zone H and the preheating zone P. A surface-blowing heater 3 is one in which a hot blowing port 4 and a gas-drawing port 5 are provided in the same plane, a fan 6 provided within the heater draws in gas through the gas-drawing port 5, and this gas is heated by a series of electric heaters 7 so that the heated hot gas is blown through the hot blowing port 4.

An example of a surface-blowing heater is one which comprises a porous metallic plate 4a and an electric heating element 7 provided at the hot blowing discharge port 4, and which has a ceramic coating applied to the surface of the porous metallic plate 4a. According to this arrangement, not only hot gas but also infrared rays can be discharged through the hot gas blowing port 4 so that printed circuit boards and solder paste placed thereon may be heated simultaneously and uniformly.

In the arrangement shown in FIG. 1 the upper and lower surface-blowing heaters 3, 3 of each pair partially overlap each other in the longitudinal direction so as to form an upward passage area X, a collision area Y, and a downward passage area Z in the gas conduit defined between the upper and lower heaters 3, 3.

As shown in FIG. 2, in the cooling zone C are provided cooling devices 10, 10 in the top and bottom portions above and below the conveyor 2. Each cooling device 10 is of the same structure as the surface blowing heaters 3, except that they are not equipped with electric heating element 7, but equipped with a heat exchanging means, i. e. cooling means.

The cooling device 10 comprises a rectifying plate 11 disposed on part of the front surface of the device. The rectifying plate 11 constitutes a cooling gas blowing port 12. Another portion of the front of the cooling device 10 constitutes a gas drawing port 14. On the opposite side of the gas blowing port 12 a rectangular hole 15 is provided and a fan 16 as means for circulating a cooling gas within the cooling device is provided above the hole. A jacket 17 made of a metallic plate is provided around one-fourth of the circumference of the fan 16 and extends laterally and then vertically. An opposite end of the jacket 17 is open to the gas-drawing port 14. The gas-drawing port 14 and the gas blowing port 12 are in the same plane.

Heat exchanging means is disposed in thermal contact with the cooling gas i. e., the heat exchanging means cools the cooling gas circulating within the cooling device indirectly through the metallic jacket 17.

An air inlet port 18 is provided each in the upper and lower walls 19 of the cooling zone C and another fan 20 as an example of blowing means is provided in each of the inlet ports 18 so as to direct outside air against the jacket 17. An air outlet port 21 is provided on another wall of the cooling zone. The air inlet and outlet ports 18, 21 and the fan 20 constitute a heat exchanging means of the cooling device 10. Thus, an inert gas cooled by the outside air is circulated through the upper and lower cooling devices 10, 10.

A nozzle 22 for introducing nitrogen gas into the reflow furnace 1 so as to maintain an inert gas atmosphere with the furnace may be provided, as shown in FIG. 1, in the first and last surface-blowing heaters 3 installed in the preheating zone P and in the cooling devices 8 installed in the cooling zone C. The nozzle 22 may be provided in either the upper or lower heater 3 (cooling device 10) and it may be provided either inside or outside the heater 3 (cooling device 10). The nozzles 22 may also be provided in each of the heaters 3 and the cooling devices 10.

Now, the flow of gas in the reflow furnace of the present invention will be described.

First, the surface-blowing heaters 3 are heated and nitrogen gas is introduced into the furnace 1 through the nozzles 22. The nitrogen gas discharged out of the nozzles 22 purges air present within the furnace, and the furnace is filled with nitrogen gas. Under these conditions, no air gets into the furnace from the outside.

When the oxygen content of the atmosphere within the furnace is reduced to be low enough to carry out soldering, printed circuit boards PB are introduced into the furnace by the conveyor 2.

According to the present invention, since a cooling gas circulates within the cooling zone and air outside the furnace is not introduced into the cooling device as a cooling gas, air outside the furnace does not have a chance to enter the furnace.

EXPERIMENT

A reflow furnace having a structure shown in FIGS. 1 and was used.

While nitrogen gas was introduced into the furnace through the nozzles 22 at a total flow rate of 180 l/min, soldering of printed circuit boards using a solder paste of the RMA type was carried out. The printed circuit board was transported by a conveyor within the reflow furnace 1, in which the board was heated to 100°–150° C. in the preheating zone P and then was heated to 200°–230° C. in the main heating zone H to effect reflowing of solder paste. After soldering, the printed circuit board entered into the cooling zone C where the board was cooled by a cooling gas blown from the top and the bottom of the zone through cooling devices 10, 10.

Since in the cooling devices 10, 10, the upper and lower surface blowers of each pair partially overlap each other in the longitudinal direction in the cooling zone, an upward passage area a collision area Y, and a downward passage area Z in the gas conduit is defined between the upper and lower surface blowers, i. e., cooling devices, and air outside the furnace cannot enter into the cooling devices 10, 10, i. e., a cooling area.

Furthermore, since a nozzle 22 for supplying nitrogen gas was provided near the outlet port of the cooling zone C, an inert gas atmosphere could be maintained efficiently within the cooling zone C, and oxidation of solder paste or printed circuit boards could be prevented successfully.

Thus, according to the present invention the content of oxygen gas within the furnace was around 100 ppm (volume), and soldering was carried out without any defects.

In contrast, when the experiment was carried out under the same conditions using a reflow furnace hav-ing a cooling zone in which air outside the furnace was used as a direct cooling gas, the oxygen content within the furnace was 20,000 ppm (volume) or higher and many soldering defects were found.

Thus, according to the present invention, as a result of providing a flow-resistant member with a simple structure, air from the outside does not get into the furnace. The furnace of the present invention is easier to use than a conventional reflow furnace using a shutter and pusher. Furthermore, the amount of nitrogen introduced into the furnace may be reduced markedly.

We claim:

1. A non-shuttered inert gas solder reflow furnace comprising:
   a conveyor for carrying printed circuit boards;
   a preheating zone, a main heating zone, and a cooling zone disposed along the conveyor; and
   a first cooling device disposed in the cooling zone and comprising a pair of a first and a second gas circulating means for circulating a cooling gas within the cooling zone while suppressing the inflow of air from outside of the furnace, said pair of gas circulating means each comprising a cooling gas blowing port and a gas drawing port, such that the cooling gas blowing port of each of the first and second gas circulating means is disposed opposite the gas drawing port of the other of the pair of gas circulating means, and a pair of a first and a second heat exchanging means respectively in thermal contact with an outside cooling gas between the gas drawing port and the cooling gas blowing port for each of the pair of the first and second cooling gas circulating means.

2. A non-shuttered inert gas solder reflow furnace comprising:
   a conveyor for carrying printed circuit boards;
   a preheating zone, a main heating zone, and a cooling zone disposed along the conveyor; and
   a first cooling device disposed in the cooling zone and comprising first gas circulating means for circulating a cooling gas within the cooling zone while suppressing the inflow of air from outside the furnace, said gas circulating means comprising a cooling gas blowing port and a gas drawing port, and a first heat exchanging means in thermal contact with an outside cooling gas between the gas drawing port and the cooling gas blowing port, said first heat exchanging means comprising an air inlet port, an air outlet port, and blowing means for circulating air through the air inlet and air outlet ports.

3. A solder reflow furnaces as set forth in claim 2 wherein the blowing means comprises a fan disposed in the air inlet port.

4. A solder reflow furnace as set forth in claim 1 further comprising means for maintaining an inert gas atmosphere within the furnace.

5. A solder reflow furnace as set forth in claim 4 wherein the means for maintaining an inert gas atmosphere within the furnace is provided near the outlet port of the cooling zone.

* * * * *